(12) United States Patent
Kim et al.

(10) Patent No.: US 12,704,879 B2
(45) Date of Patent: Aug. 11, 2026

(54) DISPLAY DEVICE

(71) Applicant: Samsung Display Co., LTD., Yongin-si (KR)

(72) Inventors: Woo Young Kim, Yongin-si (KR); Oh Jeong Kwon, Yongin-si (KR); Kyeong Jong Kim, Yongin-si (KR); Kyung Hee Lee, Yongin-si (KR); Jung Woo Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 371 days.

(21) Appl. No.: 18/499,377

(22) Filed: Nov. 1, 2023

(65) Prior Publication Data

US 2024/0192730 A1 Jun. 13, 2024

(30) Foreign Application Priority Data

Dec. 9, 2022 (KR) ........................ 10-2022-0171823

(51) Int. Cl.

| | |
|---|---|
| ***G06F 1/16*** | (2006.01) |
| ***H10K 59/80*** | (2023.01) |
| *H10K 102/00* | (2023.01) |

(52) U.S. Cl.

CPC ......... *G06F 1/1652* (2013.01); *H10K 59/873* (2023.02); *H10K 59/8791* (2023.02); *H10K 2102/3026* (2023.02); *H10K 2102/311* (2023.02)

(58) Field of Classification Search

CPC ............ G06F 1/1652; H10K 2102/311; H10K 77/111

See application file for complete search history.

(56) References Cited

U.S. PATENT DOCUMENTS

| | | | |
|---|---|---|---|
| 8,415,872 B2 | 4/2013 | Choi et al. | |
| 10,964,909 B2 | 3/2021 | Park et al. | |
| 2017/0020007 A1 * | 1/2017 | Park ....................... | H10D 86/60 |

FOREIGN PATENT DOCUMENTS

| | | |
|---|---|---|
| KR | 10-2015-0025994 | 3/2015 |
| KR | 10-2019-0069166 | 6/2019 |

OTHER PUBLICATIONS

Arun K. Singh et al., "Adhesion of Microchannel-Based Complementary Surfaces", ACS Publications, 2012 American Chemical Society, Langmuir, vol. 28, pp. 4213-4222, Feb. 8, 2012 (Total 10 pages).

* cited by examiner

*Primary Examiner* — Errol V Fernandes

(74) *Attorney, Agent, or Firm* — CANTOR COLBURN LLP

(57) ABSTRACT

A display device includes a first area, a second area, and a bending area between the first area and the second area, a light emitting element, an inorganic layer disposed on the light emitting element, and a thin film encapsulation layer disposed on the inorganic layer. The inorganic layer includes a first inorganic pattern in the bending area.

19 Claims, 11 Drawing Sheets

DA1, DA2
PXL1
PXL2
PXL3
NEMA
EMA
LBP
WD
RF
INS3
MT2
INS2
MT1
INS1
TFE
INL
CE
PDL
VIA
PSV
ILD
GI
BFL
SUB
EML1
EML2
EML3
TE1 ACT GE TE2
T
AE
TS
DPL
PCL
Z
PXL: PXL1, PXL2, PXL3
LD: LD1, LD2, LD3
LD1: AE, EML1, CE
LD2: AE, EML2, CE
LD3: AE, EML3, CE

DISPLAY DEVICE

CROSS-REFERENCE TO RELATED APPLICATION(S)

This application claims priority to and the benefits of Korean Patent Application No. 10-2022-0171823 under 35 U.S.C. § 119, filed on Dec. 9, 2022, in the Korean Intellectual Property Office (KIPO), the entire contents of which are incorporated herein by reference.

BACKGROUND

1. Technical Field

The disclosure relates to a display device.

2. Description of the Related Art

Recently, as interest in information display is increasing, research and development for display devices are continuously conducted.

SUMMARY

An object of the disclosure is to provide a display device that may reduce reflectance and at the same time minimize buckling or cracking due to folding.

Object of the disclosure is not limited to the one mentioned above, and other technical objects that are not mentioned may be clearly understood to a person of an ordinary skill in the art using the following description.

According to an embodiment, a display device may include a first area, a second area, and a bending area between the first area and the second area, a light emitting element, an inorganic layer disposed on the light emitting element, and a thin film encapsulation layer disposed on the inorganic layer. The inorganic layer may include a first inorganic pattern in the bending area.

The first inorganic pattern may include an extension and a protrusion protruding from the extension.

The first inorganic pattern may include an extension and a bent portion bent from the extension.

The first inorganic pattern may include holes spaced apart from each other.

The inorganic layer may at least partially cover the light emitting element in the first area.

The first area and the second area may be spaced apart from each other in a first direction, and the bending area may extend in a second direction intersecting the first direction.

The first area may include a first edge area extending in the second direction on an edge of the first area, and the inorganic layer may further include a second inorganic pattern in the first edge area.

The second area may include a second edge area extending in the second direction on an edge of the second area, and the inorganic layer may further include a third inorganic pattern in the second edge area.

The first to third inorganic patterns may have a same pattern in a plan view.

The thin film encapsulation layer may contact the first to third inorganic patterns.

The inorganic layer may include at least one of bismuth (Bi), ytterbium (Yb), nickel (Ni), cobalt (Co), beryllium (Be), vanadium (V), titanium (Ti), zirconium (Zr), tungsten (W), tantalum (Ta), and molybdenum oxide ($MoO_3$).

A refractive index of the inorganic layer may be greater than or equal to about 1.0.

An extinction coefficient of the inorganic layer may be less than or equal to about 4.0.

According to an embodiment, a display device may include a first area and a second area spaced apart from each other in a first direction, a bending area disposed between the first area and the second area and bendable with respect to a bending axis extending in a second direction intersecting the first direction, a light emitting element, an inorganic layer disposed on the light emitting element, and a thin film encapsulation layer disposed on the inorganic layer. The inorganic layer may include a first inorganic pattern in the bending area.

The first area may include a first edge area extending in the second direction on an edge of the first area, and the inorganic layer may further include a second inorganic pattern in the first edge area.

The second area may include a second edge area extending in the second direction on an edge of the second area, and the inorganic layer may further include a third inorganic pattern in the second edge area.

The thin film encapsulation layer may contact the first to third inorganic patterns.

The display device may further include a reflection control layer disposed on the inorganic layer.

The display device may further include a light blocking layer disposed between the inorganic layer and the reflection control layer.

The reflection control layer may include a pigment or dye.

Particularities of other embodiments are included in the detailed description and drawings.

According to the above-described embodiment, inorganic patterns may be partially formed in a folding area, a first edge area, and/or a second edge area to enhance adhesion between an inorganic layer and a thin film encapsulation layer. Therefore, even in case that a display device is repeatedly folded, buckling or cracks may be minimized in the folding area, the first edge area, and/or the second edge area.

Effects of embodiments of the disclosure are not limited by what is illustrated above, and various effects are included in the specification.

DETAILED DESCRIPTION OF THE EMBODIMENTS

Figure 1:
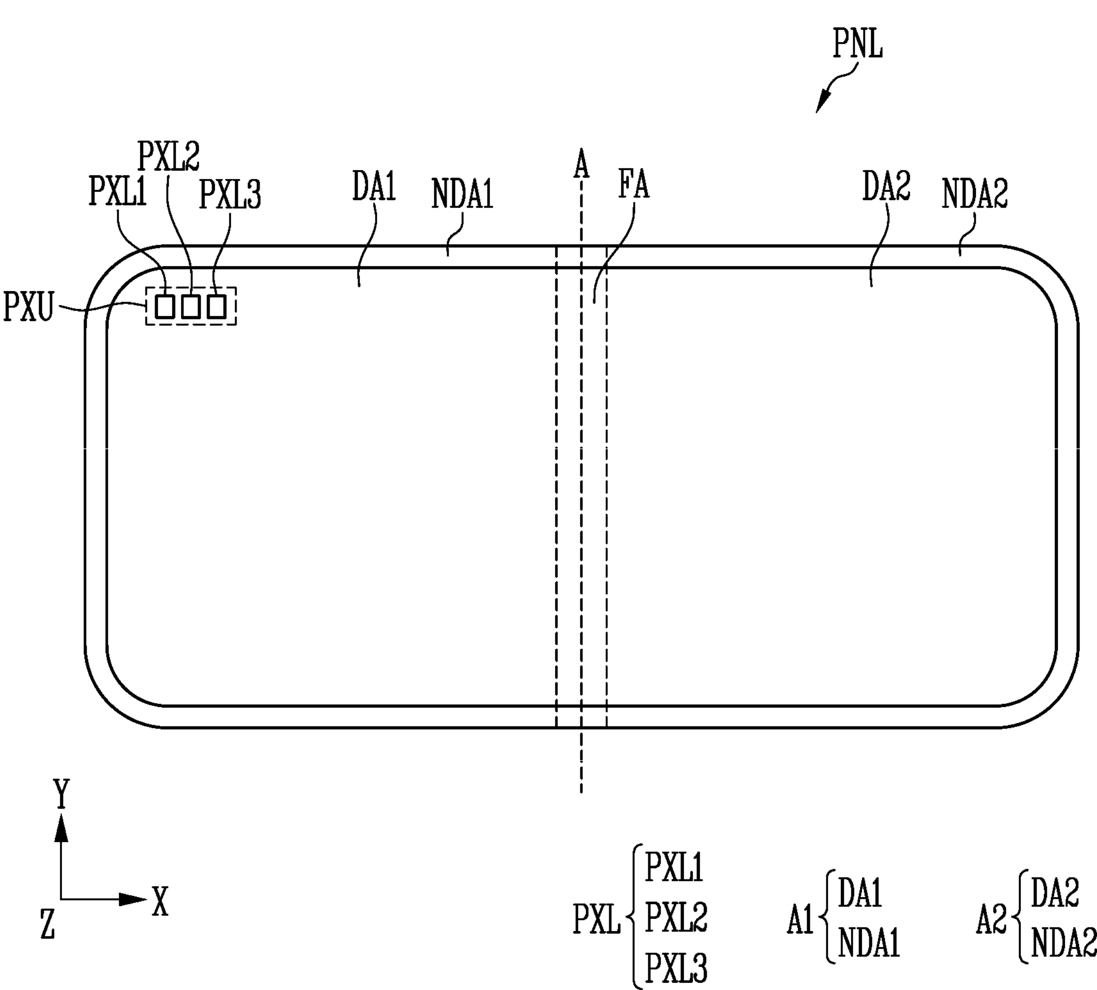
FIG. 1 illustrates a top plan view of an unfolded state of a foldable electronic device according to an embodiment.

Advantages and features of the disclosure and methods of accomplishing the same may be understood more readily by reference to the following detailed description of embodiments and the accompanying drawings. The disclosure may, however, be embodied in different forms and should not be construed as limited to the embodiments set forth herein. The embodiments are provided so that this disclosure will be more thorough and complete, and will fully convey the scope of the disclosure to those skilled in the art.

The terms used herein are for the purpose of describing particular embodiments only and are not intended to be limiting. As used herein, the singular forms "a", "an" and "the" are intended to include the plural forms as well, unless the context clearly indicates otherwise. It will be further understood that the terms "comprise" and/or "comprising", "include" or "including", and "have" or "having", when used in the disclosure, specify the presence of stated elements, steps, operations, and/or devices, but do not preclude the presence or addition of one or more other elements, steps, operations, and/or devices.

The term "connection" or "coupling" may comprehensively mean a physical and/or electrical connection or coupling. This may comprehensively mean a direct or indirect connection or coupling, and an integrated or non-integrated connection or coupling.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Throughout the specification, the same reference numerals denote the same constituent elements.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the technical spirit of the disclosure.

It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described in detail with reference to the accompanying drawings.

Figure 2:
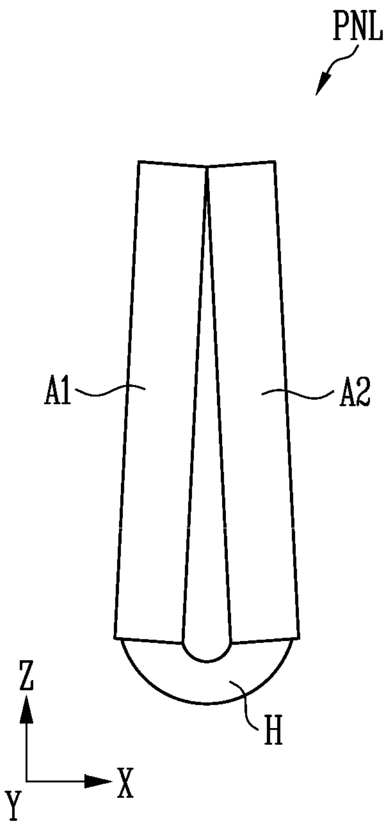
FIG. 2 illustrates a side view of a folded state of the foldable electronic device of FIG. 1.

FIG. 1 illustrates a top plan view of an unfolded state of a foldable electronic device according to an embodiment. FIG. 2 illustrates a side view of a folded state of the foldable electronic device of FIG. 1. FIG. 1 and FIG. 2 illustrate a display panel PNL provided in a foldable electronic device.

Referring to FIG. 1 and FIG. 2, as an embodiment of a foldable electronic device, a display device, in particular, a display panel PNL included in the display device will be described. The display panel PNL may include a first area A1, a second area A2, and/or a folding area FA (or a bending area). The first area A1 and the second area A2 may be spaced apart from each other in a first direction (an X-axis direction). The folding area FA may be positioned between the first area A1 and the second area A2. The folding area FA may be folded (or bent) around a folding axis A (or a bending axis) extending in a second direction (a Y-axis direction) intersecting the first direction (X-axis direction).

In case that the display panel PNL is folded, the first area A1 and the second area A2 may face each other. For example, the first area A1 and the second area A2 may be coupled to a hinge structure H positioned at the folding axis A to be rotated with respect to the hinge structure H. The first area A1 and the second area A2 may have shapes that are symmetrical to each other, but the disclosure is not necessarily limited thereto. In case that the foldable electronic device, for example, the display panel PNL is unfolded, the hinge structure H may not be exposed by being covered by the first area A1 and the second area A2. In case that the display panel PNL is folded, the hinge structure H may be at least partially exposed to the outside after the first area A1 and the second area A2 are rotated.

The first area A1 may include a first display area DA1 displaying an image and a first non-display area NDA1 not displaying an image. The first non-display area NDA1 may be disposed adjacent to the first display area DAL.

The second area A2 may include a second display area DA2 displaying an image and a second non-display area NDA2 not displaying an image. The second non-display area NDA2 may be disposed adjacent to the second display area DA2.

The first display area DA1, the second display area DA2, and/or the folding area FA may configure a screen on which an image is displayed, and the first non-display area NDA1 and the second non-display area NDA2 may be an area other than the first display area DA1, the second display area DA2, and/or the folding area FA.

For better understanding and ease of description, in FIG. 1, the structure of the display panel PNL is briefly illustrated centering on the first display area DA1, the second display area DA2, and the folding area FA. However, in embodiments, at least one driving circuit part (for example, at least one of a scan driver and a data driver), wires, and/or pads may be disposed in the display panel PNL.

A pixel unit PXU may be disposed in the first display area DA1, the second display area DA2, and/or the folding area FA. The pixel unit PXU may include a first pixel PXL1, a second pixel PXL2, and/or a third pixel PXL3. Hereinafter, when arbitrarily referring to at least one of the first pixel PXL1, the second pixel PXL2, and the third pixel PXL3, or when comprehensively referring to two or more types of pixels thereof, they will be referred to as a "pixel PXL" or "pixels PXL".

The pixels PXL may be regularly arranged according to a stripe or PENTILE™ arrangement structure. However, the arrangement structure of the pixels PXL is not limited thereto, and the pixels PXL may be arranged in the display area DA in various structures and/or methods.

Figure 3:
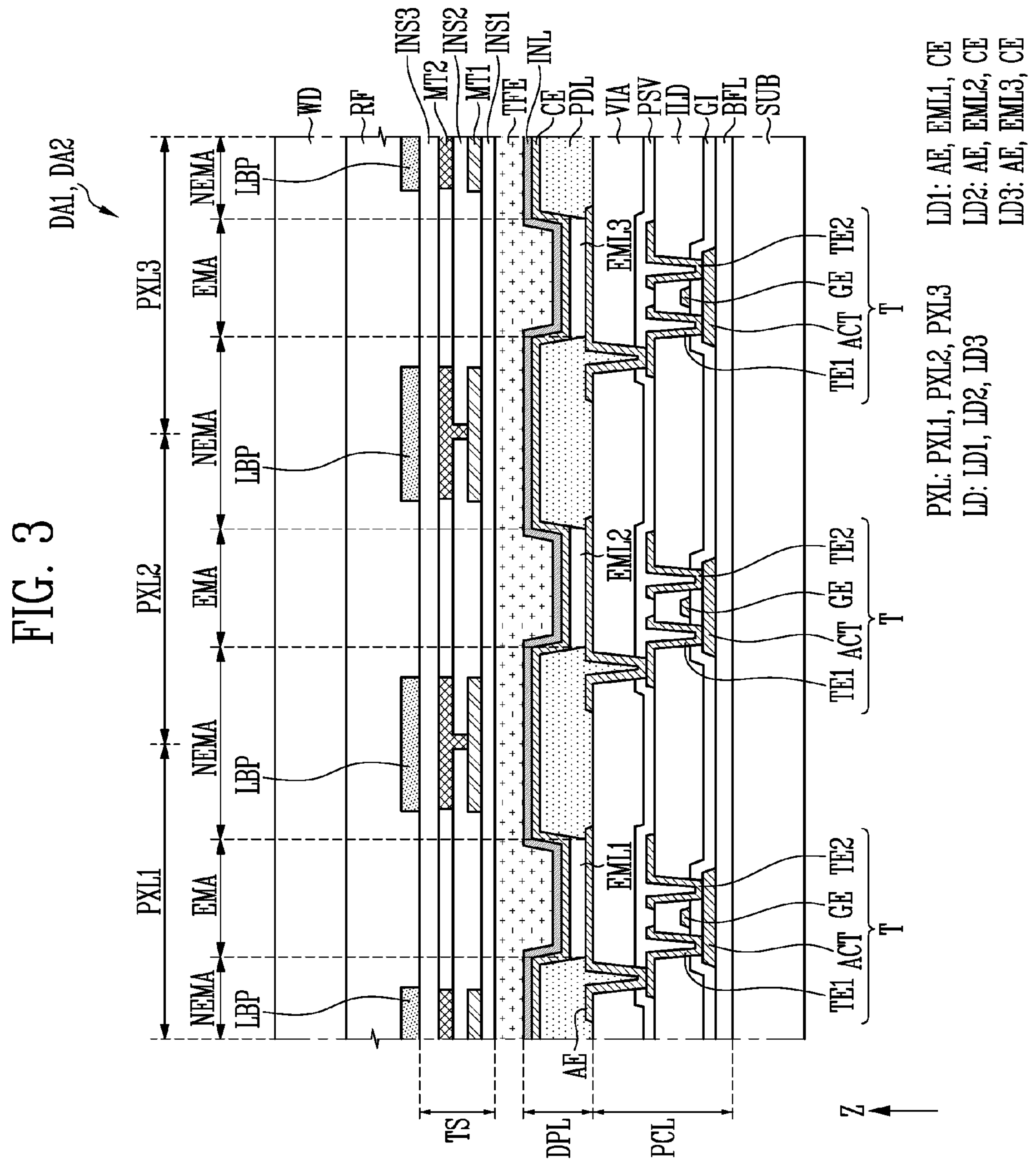
FIG. 3 illustrates a schematic cross-sectional view of a display panel according to an embodiment.

In embodiments, two or more types of pixels PXL emitting light of different colors may be disposed in the first display area DA1, the second display area DA2, and/or the folding area FA. For example, the first pixels PXL1 emitting light of a first color, the second pixels PXL2 emitting light of a second color, and the third pixels PXL3 emitting light of a third color may be arranged in the first display area DA1, the second display area DA2, and/or the folding area FA. At least one of the first to third pixels PXL1, PXL2, and PXL3 disposed to be adjacent to each other may form one pixel unit PXU that may emit light of various colors. For example, the first pixel PXL1 may be a red pixel that emits red light, the second pixel PXL2 may be a green pixel that emits green light, and the third pixel PXL3 may be a blue pixel that emits blue light, but the disclosure is not limited thereto. FIG. 3 illustrates a case in which the pixel unit PXU includes one first pixel PXL1, one second pixel PXL2, and one third pixel PXL3, but the disclosure is not necessarily limited thereto, and in an embodiment, the pixel unit PXU may include one first pixel PXL1, two second pixels PXL2, and one third pixel PXL3.

The first pixel PXL1, the second pixel PXL2, and the third pixel PXL3 may include a first light emitting element (LD1 in FIG. 3), a second light emitting element (LD2 in FIG. 3), and a third light emitting element (LD3 in FIG. 3) as light sources, respectively, so that the first pixel PXL1, the second pixel PXL2, and the third pixel PXL3 may emit light of the first color, light of the second color, and light of the third color, respectively. However, the disclosure is not limited thereto, and the color of light emitted by each pixel PXL may be variously changed.

Figure 4:
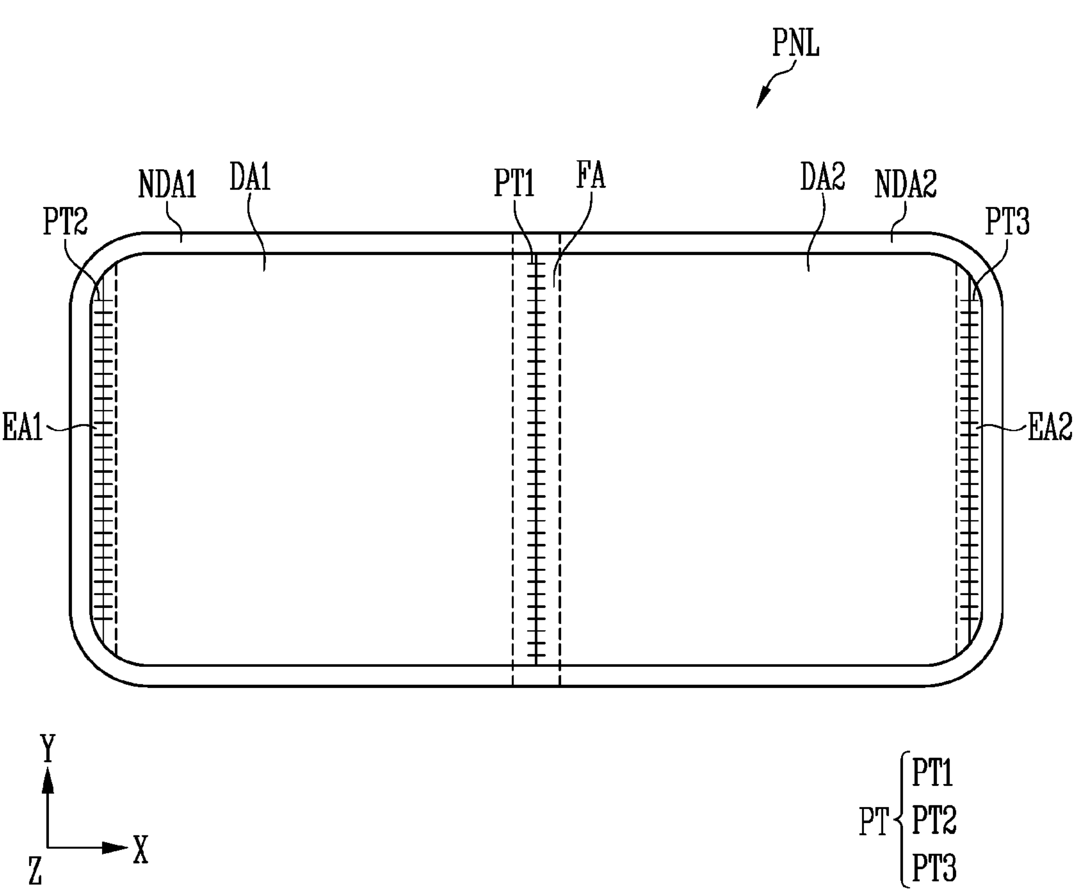
FIG. 4 illustrates a top plan view of a display panel according to an embodiment.
Figure 5:
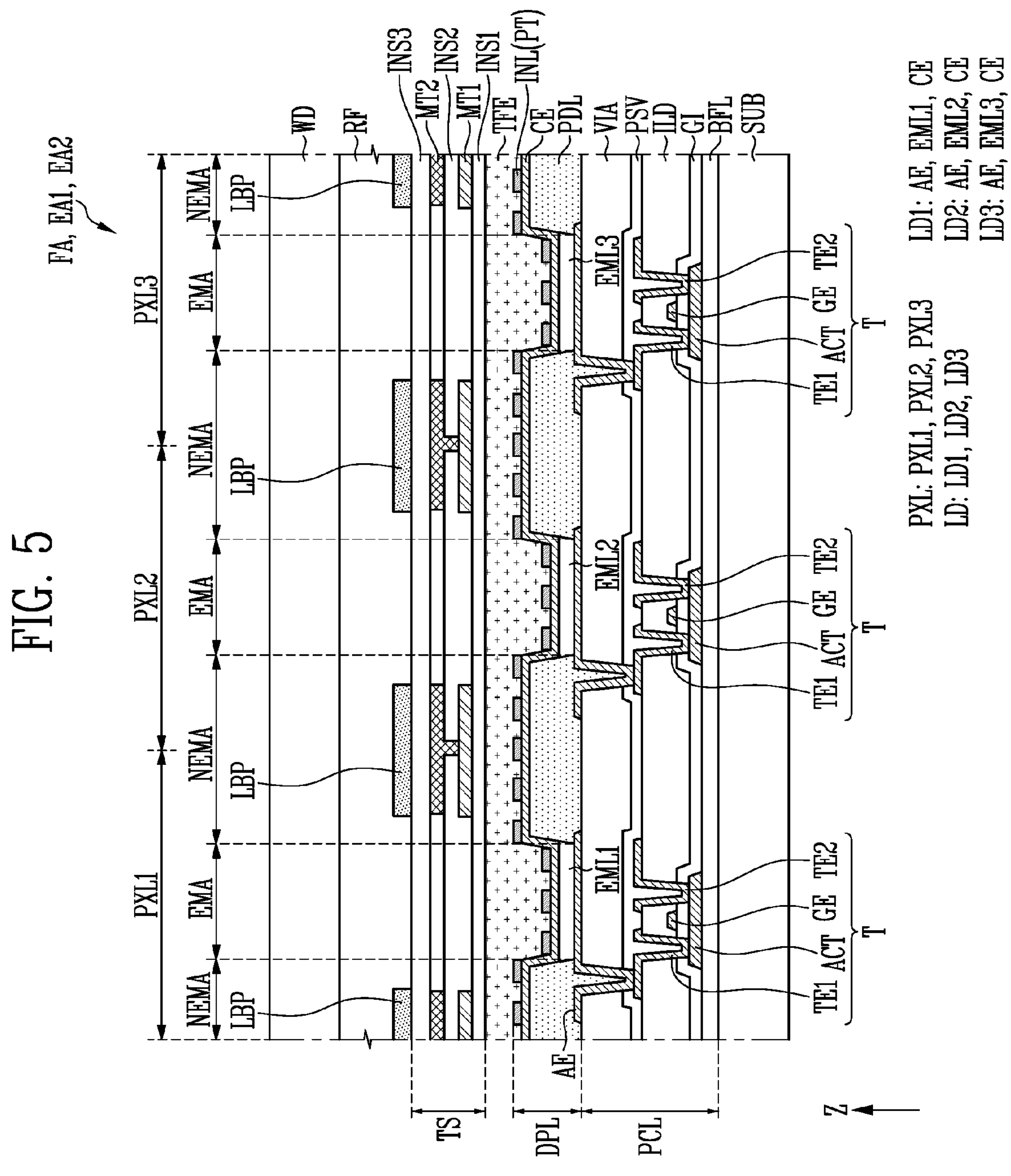
FIG. 5 illustrates a schematic cross-sectional view of a display panel according to an embodiment.

FIG. 3 illustrates a schematic cross-sectional view of a display panel according to an embodiment. FIG. 3 illustrates a schematic cross-section of the display panel PNL of the first display area DA1 and the second display area DA2. FIG. 4 illustrates a top plan view of a display panel according to an embodiment. FIG. 5 illustrates a schematic cross-sectional view of a display panel according to an embodiment. FIG. 5 illustrates a schematic cross-sectional view of the display panel PNL of the folding area FA, the first edge area EA1, and the second edge area EA2. FIG. 6 to FIG. 11 illustrate top plan views of an inorganic pattern according to an embodiment.

Referring to FIG. 3, the first to third pixels PXL1, PXL2, and PXL3 may each include a light emitting area EMA, and a non-light emitting area NEMA may be positioned between the light emitting areas EMA of each of the first to third pixels PXL1, PXL2, and PXL3.

The first to third pixels PXL1, PXL2, and PXL3 may each include a pixel circuit layer PCL, a display element layer DPL, and a thin film encapsulation layer TFE sequentially disposed on a substrate SUB.

The substrate SUB may form a base surface. The substrate SUB may include a transparent insulation material to transmit light. The substrate SUB may be a rigid substrate or a flexible substrate. For example, the rigid substrate may be one of a glass substrate, a quartz substrate, a glass ceramic substrate, and a crystalline glass substrate. The flexible substrate may be one of a film substrate and a plastic substrate, which include a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate, but the disclosure is not necessarily limited thereto.

The pixel circuit layer PCL may include a pixel circuit provided on the substrate SUB. The pixel circuit layer PCL may include a buffer layer BFL, a gate insulation layer GI, an interlayer insulation layer ILD, a passivation layer PSV, and a via layer VIA that are sequentially stacked on the substrate SUB in a third direction (a Z-axis direction).

The buffer layer BFL may be an inorganic insulation film including an inorganic material. The buffer layer BFL may include at least one of a silicon nitride ($SiN_x$), a silicon oxide ($SiO_x$), a silicon oxynitride ($SiO_xN_y$), and a metal oxide such as an aluminum oxide ($AlO_x$). The buffer layer BFL may be provided as a single layer, or a multilayer of at least double layers or more. In case that the buffer layer BFL is provided as multiple layers, each of the multiple layers may be made of a same material or different materials. The buffer layer BFL may be omitted depending on the material, a process condition, and the like of the substrate SUB.

A transistor T may be disposed on the buffer layer BFL. The transistor T may include an active pattern ACT, a gate electrode GE, a first transistor electrode TE1, and a second transistor electrode TE2.

The active pattern ACT may be disposed on the buffer layer BFL. The active pattern ACT may include a polysilicon semiconductor. For example, the active pattern ACT may be formed through a low temperature polysilicon process. However, the disclosure is not necessarily limited thereto, and the active pattern ACT may be formed of an oxide semiconductor, a metal oxide semiconductor, or the like.

Each active pattern ACT may include a channel area, a first contact area connected to an end of the channel area, and a second contact area connected to another end of the channel area. The channel area, the first contact area, and the second contact area may be formed of a semiconductor layer in which an impurity is not doped or an impurity is doped. For example, the first contact area and the second contact area may be formed of a semiconductor layer doped with an impurity, and the channel area may be formed of a semiconductor layer that is not doped with an impurity. As the impurity, for example, a p-type impurity may be used, but the disclosure is not limited thereto. One of the first and second contact areas may be a source area, and another of the first and second contact areas may be a drain area.

The gate insulation layer GI may be disposed on the active pattern ACT. The gate insulation layer GI may be an inorganic film (or an inorganic insulation film) including an inorganic material. For example, the gate insulation layer GI may include at least one of a silicon nitride ($SiN_x$), a silicon oxide ($SiO_x$), a silicon oxynitride ($SiO_xN_y$), and a metal oxide such as an aluminum oxide ($AlO_x$). However, the material of the gate insulation layer GI is not limited thereto. In embodiments, the gate insulation layer GI may be formed as an organic film (or organic insulation film) including an organic material. The gate insulation layer GI may be provided as a single layer or a multilayer of at least double layers or more.

The gate electrode GE may be disposed on the gate insulation layer GI. The gate electrode GE may overlap the channel area of the active pattern ACT in a plan view. The gate electrode GE may be formed to have a single-layered structure including a material selected from the group consisting of copper (Cu), molybdenum (Mo), tungsten (W), aluminum neodymium (AlNd), titanium (Ti), aluminum (Al), silver (Ag), and an alloy thereof, or in order to reduce wire resistance, may be formed to have a double-layered or multi-layered structure including a low-resistance material such as molybdenum (Mo), titanium (Ti), copper (Cu), aluminum (Al), or silver (Ag).

The interlayer insulation layer ILD may be disposed on the gate electrode GE. The interlayer insulation layer ILD and the gate insulation layer GI may include a same material, or the interlayer insulation layer ILD may include one or more materials selected from the materials that can be included in the gate insulation layer GI.

The first transistor electrode TE1 and the second transistor electrode TE2 may be disposed on an interlayer insulation layer ILD.

The first transistor electrode TE1 of the transistor T may contact the first contact area of an end of the active pattern ACT through a contact hole penetrating the interlayer insulation layer ILD and the gate insulation layer GI. In case that the first contact area is a source area, the first transistor electrode TE1 may be a first source electrode.

The second transistor electrode TE2 of the transistor T may contact the second contact area of another end of the active pattern ACT through a contact hole penetrating the interlayer insulation layer ILD and the gate insulation layer GI. In case that the second contact area is a drain area, the second transistor electrode TE2 may be a second drain electrode.

Each of the first transistor electrode TE1 and the second transistor electrode TE2 and the gate electrode GE may include a same material or each of the first transistor electrode TE1 and the second transistor electrode TE2 may include one or more materials selected from the materials that can be included in the gate electrode GE.

The passivation layer PSV may be disposed on the first transistor electrode TE1 and the transistor electrodes TE2. The passivation layer PSV (for example, protective layer) may be an inorganic film (or an inorganic insulation film) including an inorganic material or an organic film (or an organic insulation film) including an organic material. The inorganic film may include, for example, at least one of a silicon nitride ($SiN_x$), a silicon oxide ($SiO_x$), a silicon oxynitride ($SiO_xN_y$), and a metal oxide such as an aluminum oxide ($AlO_x$). The organic film may include, for example, at least one of a polyacrylates resin, an epoxy resin, a phenolic resin, a polyamides resin, a polyimides rein, an unsaturated polyesters resin, a poly-phenylene ethers resin, a poly-phenylene sulfides resin, and a benzocyclobutene resin.

In embodiments, the passivation layer PSV and the interlayer insulation layer ILD may include a same material, but the disclosure is not limited thereto. The passivation layer PSV may be provided as a single layer or a multilayer of at least double layers or more.

The via layer VIA may be disposed on the passivation layer PSV. The via layer VIA and the passivation layer PSV may include a same material, or the via layer VIA may include at least one selected from materials that can be included in the passivation layer PSV. In an embodiment, the via layer VIA may be an organic film made of an organic material.

The display element layer DPL may be disposed on the pixel circuit layer PCL. The display element layer DPL may include the light emitting element LD that emits light. The first to third pixels PXL1, PXL2, and PXL3 may include the first to third light emitting elements LD1, LD2, and LD3, respectively.

The first light emitting element LD1 may include an anode electrode AE, a first light emitting layer EML1, and a cathode electrode CE. The second light emitting element LD2 may include an anode electrode AE, a second light emitting layer EML2, and a cathode electrode CE. The third light emitting element LD3 may include an anode electrode AE, a third light emitting layer EML3, and a cathode electrode CE. For example, the first to third light emitting elements LD1, LD2, and LD3 may be top light emitting type organic light emitting elements.

The anode electrodes AE of respective pixels PXL may be disposed in the light emitting area EMA, and may be spaced apart from each other. The anode electrode AE of each pixel PXL may be electrically connected to the first transistor electrode TE1 of the transistor T of each pixel PXL through a contact hole penetrating the via layer VIA and the passivation layer PSV.

A bank PDL may be disposed on the anode electrode AE and the via layer VIA. The bank PDL may define (or partition) the light emitting area EMA of each pixel PXL. The bank PDL may include an opening partially exposing the anode electrode AE of each pixel PXL, and the opening may correspond to the light emitting area EMA of each pixel PXL.

The bank PDL may be an organic insulation layer made of an organic material. The organic material may include an acryl resin, an epoxy resin, a phenolic resin, a polyamide resin, a polyimide resin, or the like.

In embodiments, the bank PDL may include a light absorbing material, or may serve to absorb light introduced from the outside by a light absorbing agent being applied thereon. For example, the bank PDL may include a carbon-based black pigment. However, the disclosure is not necessarily limited thereto, and the bank PDL may include an opaque metallic material such as chromium (Cr), molybdenum (Mo), an alloy (MoTi) of molybdenum (Mo) and titanium (Ti), tungsten (W), vanadium (V), niobium (Nb), tantalum (Ta), manganese (Mn), cobalt (Co), or nickel (Ni), which has a high light absorption rate.

The light emitting layer EML of each pixel PXL may be disposed on the anode electrode AE exposed by the bank PDL. The cathode electrode CE may be disposed on the light emitting layer EML. The cathode electrode CE may be entirely disposed on the first to third pixels PXL1, PXL2, and PXL3. For example, the cathode electrode CE may be provided as a common electrode, but the disclosure is not necessarily limited thereto.

The cathode electrode CE may be formed of a metal layer including at least one of Ag (silver), Mg (magnesium), Al (aluminum), Pt (platinum), Pd (palladium), Au (gold), Ni (nickel), Nd (neodymium), Ir (iridium), Cr (chromium), and an alloy thereof and/or a transparent conductive layer including at least one of an ITO (indium tin oxide), an IZO (indium zinc oxide), a ZnO (zinc oxide), and ITZO (indium tin zinc oxide). In embodiments, the cathode electrode CE may be formed of a multilayer of a double layer or more including a thin metal layer, for example, a triple layer of ITO/Ag/ITO.

An inorganic layer INL may be disposed on the cathode electrode CE. The inorganic layer INL may reduce reflectance and improve transmittance to realize a highly efficient display panel PNL. The inorganic layer INL may include at least one of bismuth (Bi), ytterbium (Yb), nickel (Ni), cobalt (Co), beryllium (Be), vanadium (V), titanium (Ti), zirconium (Zr), tungsten (W), tantalum (Ta), and a molybdenum oxide ($MoO_3$). For example, the inorganic layer INL may be formed by depositing at least one of bismuth (Bi), ytterbium (Yb), nickel (Ni), cobalt (Co), beryllium (Be), vanadium (V), titanium (Ti), zirconium (Zr), tungsten (W), tantalum (Ta), and a molybdenum oxide ($MoO_3$) on the display element layer DPL (or cathode electrode CE). A refractive index of the inorganic layer INL may be greater than or equal to about 1.0. For example, the refractive index of the inorganic layer INL may be in a range of about 1.0 to about 3.0. An extinction coefficient of the inorganic layer INL may be less than or equal to about 4.0. For example, the extinction coefficient of the inorganic layer INL may be in a range of about 0.5 to about 4.0. As described above, by providing the inorganic layer INL having a low extinction coefficient, the display panel PNL with high-efficiency may be implemented by reducing reflectance by inducing interference between reflected lights of the electrode layer and the inorganic layer INL and improving transmittance. A thickness of the inorganic layer INL in the third direction (Z-axis direction) may be in a range of about 70 Å to about 150 Å, but the disclosure is not necessarily limited thereto.

The inorganic layer INL, as shown in FIG. 3, may at least partially cover the first display area DA1 or the second display area DA2. For example, the inorganic layer INL may cover the first display area DA1 excluding the first edge area (EA1 in FIG. 4) and the second display area DA2 excluding the second edge area (EA2 in FIG. 4).

The inorganic layer INL may include an inorganic pattern PT. For example, as shown in FIG. 4, the inorganic pattern PT may include a first inorganic pattern PT1 overlapping the folding area FA, a second inorganic pattern PT2 overlapping the first display area DA1, and/or a third inorganic pattern PT3 overlapping the second display area DA2 in a plan view.

The first inorganic pattern PT1 may be arranged in the second direction (Y-axis direction) within the folding area FA.

The second inorganic pattern PT2 may overlap the first edge area EA1 of the first display area DA1 in a plan view. The first edge area EA1 may be an area extending in the second direction (Y-axis direction) on an edge of the first display area DA1 in the first direction (X-axis direction). The second inorganic patterns PT2 may be arranged in the second direction (Y-axis direction) within the first edge area EAL.

The third inorganic pattern PT3 may overlap the second edge area EA2 of the second display area DA2 in a plan view. The second edge area EA2 may be an area extending in the second direction (Y-axis direction) on an edge of the second display area DA2 in the first direction (X-axis direction). The third inorganic patterns PT3 may be arranged in the second direction (Y-axis direction) within the second edge area EA2.

The thin film encapsulation layer TFE disposed on the inorganic layer INL (or the inorganic pattern PT) may contact the first to third inorganic patterns PT1, PT2, and PT3. In embodiments, the inorganic pattern PT may expose an upper surface of the light emitting element LD (or the cathode electrode CE) disposed thereunder. The thin film encapsulation layer TFE may contact the upper surface of the light emitting element LD (or cathode electrode CE) exposed by each inorganic pattern PT.

The first to third inorganic patterns PT1, PT2, and PT3 may be formed in a same pattern. In embodiments, the first to third inorganic patterns PT1, PT2, and PT3 may have different patterns.

Figure 6:
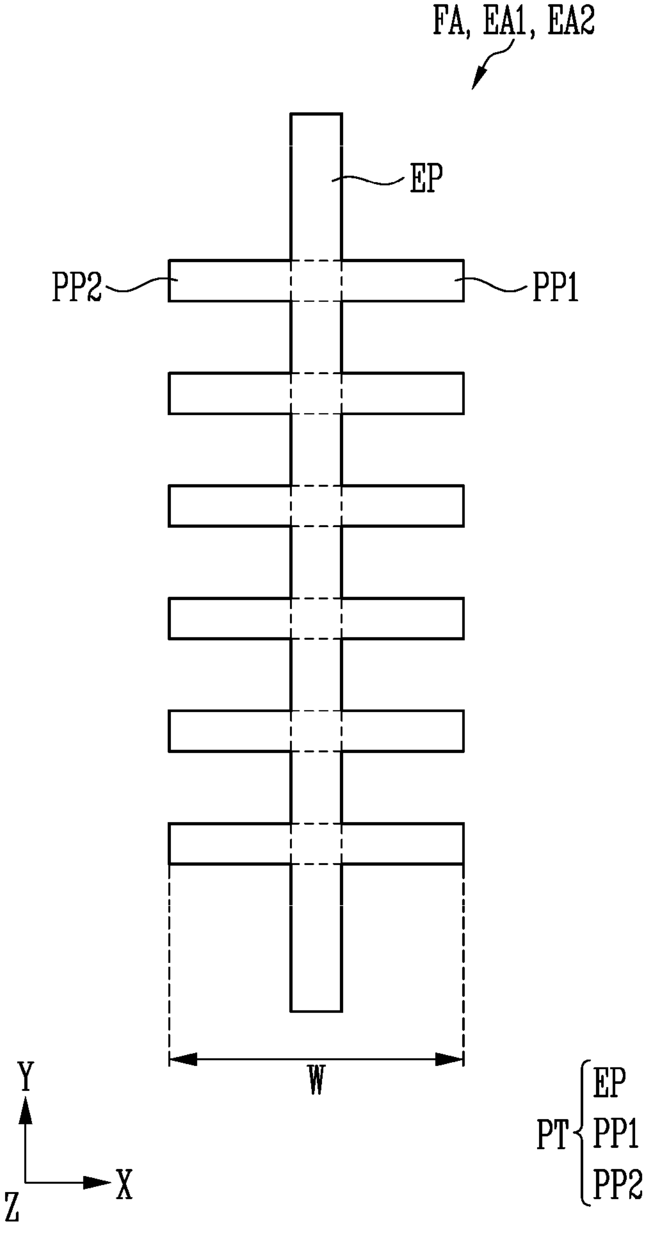
FIG. 6 is a top plan view of an inorganic pattern according to an embodiment.

Referring to FIG. 6, the inorganic patterns PT may include an extension EP and protrusions PP1 and PP2 protruding from the extension EP. The extension EP may extend in the second direction (Y-axis direction). The first protrusion PP1 may protrude in the first direction (X-axis direction) from the extension EP. The second protrusion PP2 may protrude in a direction opposite to the first direction (X-axis direction) from the extension EP. In the embodiment, a width W of the inorganic pattern PT in the first direction (X-axis direction), for example, a distance from an end of the first protrusion PP1 to an end of the second protrusion PP2 may be in a range of about 10 um to about 15 um, but the disclosure is not necessarily limited thereto.

Figure 7:
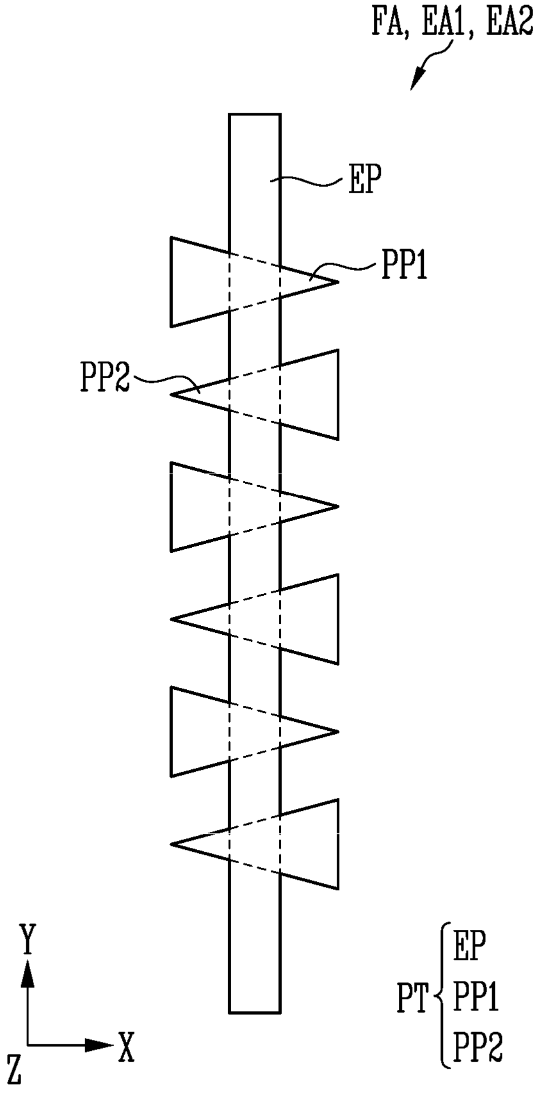
FIG. 7 is a top plan view of an inorganic pattern according to an embodiment.
Figure 8:
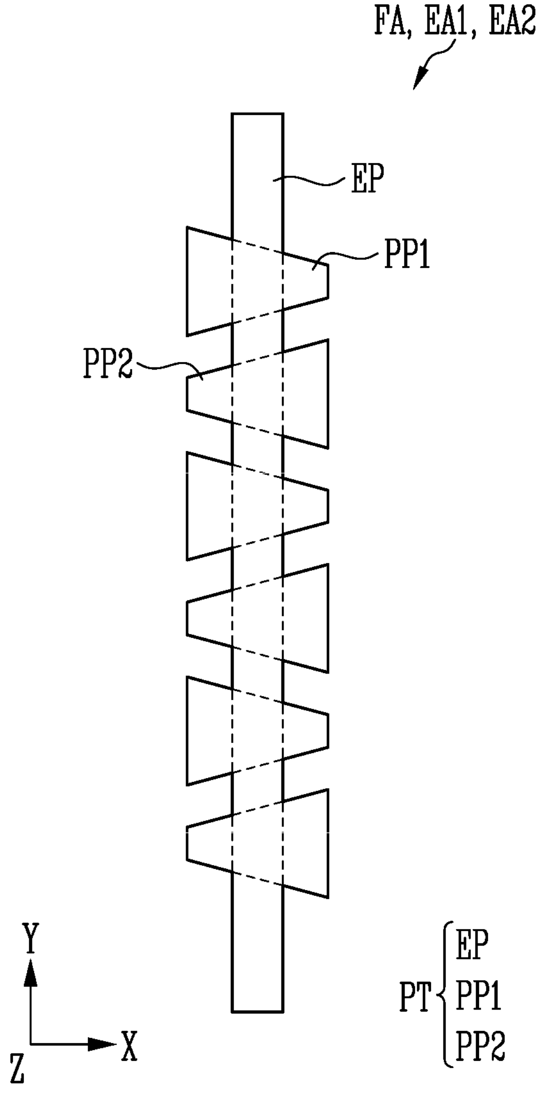
FIG. 8 is a top plan view of an inorganic pattern according to an embodiment.

FIG. 6 illustrates a case in which the first protrusion PP1 and the second protrusion PP2 protrude in opposite directions from a same position of the extension EP, but the disclosure is not necessarily limited thereto. For example, as shown in FIG. 7 and FIG. 8, the first protrusion PP1 and the second protrusion PP2 may alternately arranged in the second direction (Y-axis direction) and may protrude in the first direction (X-axis direction). Each of the first protrusion PP1 and the second protrusion PP2 may be formed in various shapes such as a triangular shape (see FIG. 7), a trapezoidal shape (see FIG. 8), and a circular shape in a plan view.

Figure 9:
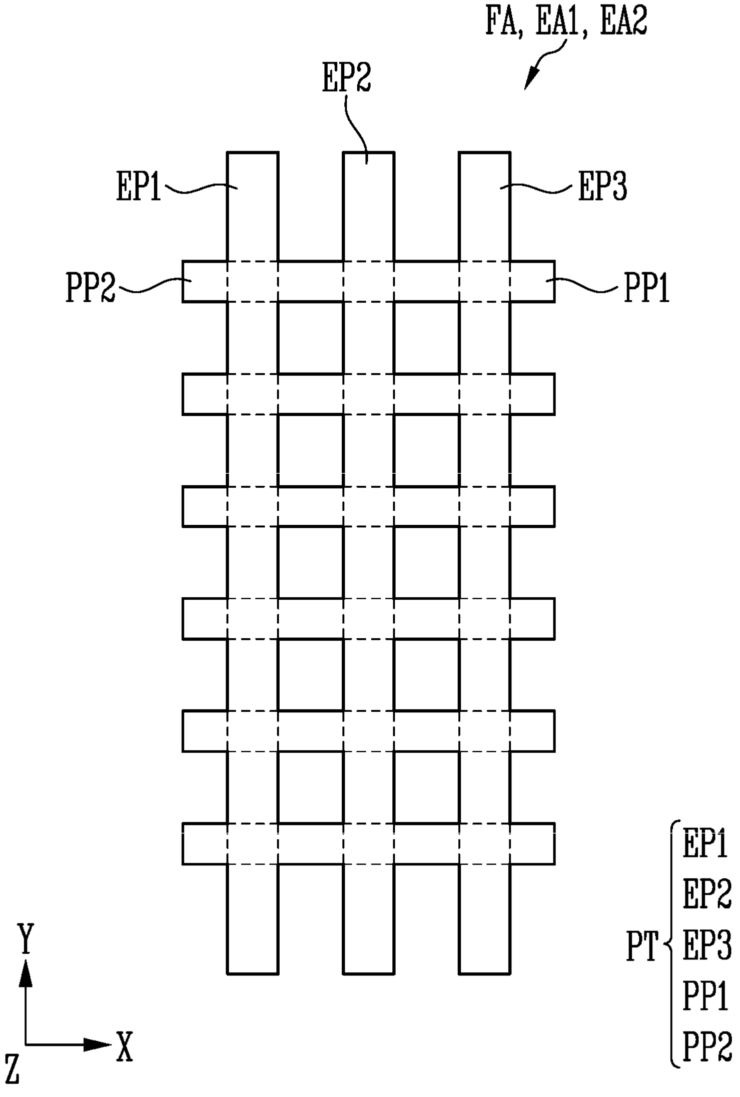
FIG. 9 is a top plan view of an inorganic pattern according to an embodiment.

Referring to FIG. 9, the inorganic pattern PT may include multiple extensions EP1, EP2, and EP3. The first to third extensions EP1, EP2, and EP3 may each extend in the second direction (Y-axis direction) and may be spaced apart from each other in the first direction (X-axis direction). The second extension EP2 may be disposed between the first extension EP1 and the third extension EP3. The first protrusion PP1 and the second protrusion PP2 may protrude from the second extension EP2 in the first direction (X-axis direction) and cross the first extension EP1 or the third extension EP3. For example, the first protrusion PP1 may protrude in the first direction (X-axis direction) from the second extension EP2 and cross the third extension EP3. The second protrusion PP2 may protrude from the second extension EP2 in an opposite direction of the first direction (X-axis direction) and cross the first extension EPL.

Figure 10:
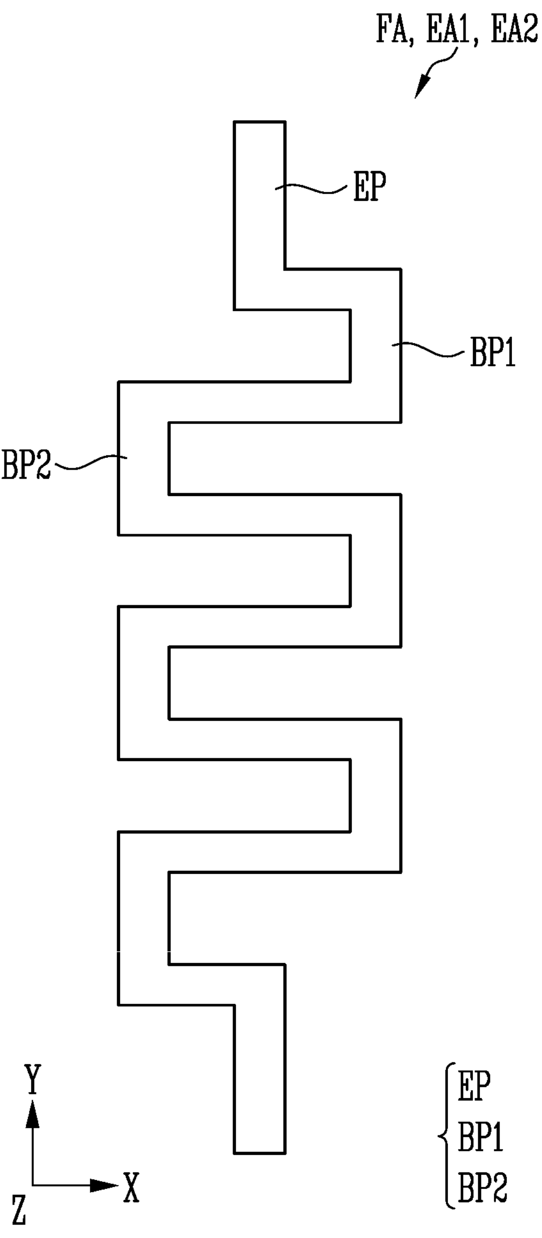
FIG. 10 is a top plan view of an inorganic pattern according to an embodiment.

Referring to FIG. 10, the inorganic patterns PT may include an extension EP and bent portions BP1 and BP2 bent from the extension EP. The extension EP may extend in the second direction (Y-axis direction). The first bent portion BP1 may be bent in the first direction (X-axis direction) from the extension EP. The second bent portion BP1 may be bent in a direction opposite to the first direction (X-axis direction) from the extension EP.

Figure 11:
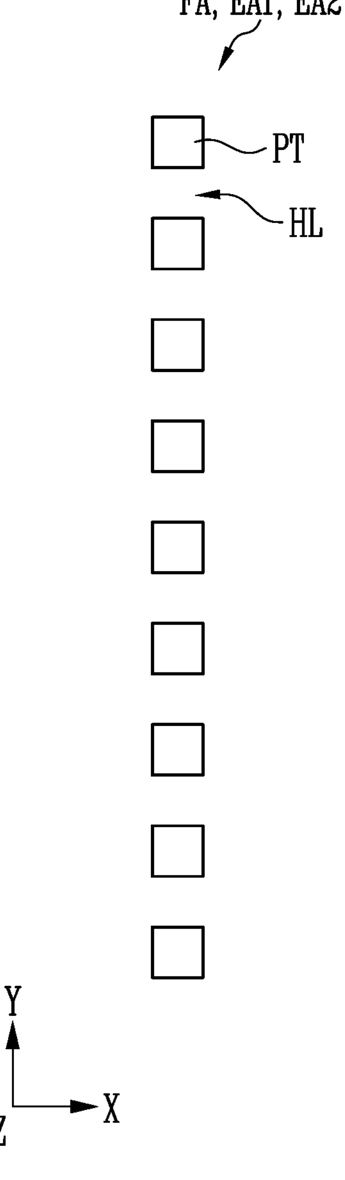
FIG. 11 is a top plan view of an inorganic pattern according to an embodiment.

Referring to FIG. 11, the inorganic patterns PT may each include holes HL spaced apart from each other in the second direction (Y-axis direction). The inorganic patterns PT may be spaced apart from in the second direction (Y-axis direction) each other with at least one hole HL between the inorganic patterns PT.

In the above-described embodiments, in case that the inorganic patterns PT are partially formed in the folding area FA, the first edge area EA1, and/or the second edge area EA2, a contact area between the inorganic layer INL and the thin film encapsulation layer TFE may be increased to enhance adhesive strength. For example, in case that the inorganic layer INL is continuously formed in the folding area FA, the first edge area EA1, and/or the second edge area EA2, an average peel force may be in a range of about 0.06 gf/inch to about 0.45 gf./inch, and in case that the inorganic layer INL includes the inorganic pattern PT formed in the folding area FA, the first edge area EA1, and/or the second edge area EA2, an average peel force may be in a range of about 0.23 gf/inch to about 0.86 gf/inch. It can be confirmed that the adhesion force may be improved by partially forming the inorganic patterns PT in the folding area FA, the first edge area EA1, and/or the second edge area EA2. Accordingly, even in case that folding is repeated in the folding area FA, occurrence of buckling or cracking in the folding area FA, the first edge area EA1, and/or the second edge area EA2 may be minimized.

Referring to FIG. 5, the thin film encapsulation layer TFE may be disposed on the display element layer DPL. The thin film encapsulation layer TFE may have a single-layered structure or a multi-layered structure. The thin film encapsulation layer TFE may include multiple insulation layers covering the light emitting element LD. The thin film encapsulation layer TFE may include at least one inorganic film and at least one organic film. For example, the thin film encapsulation layer TFE may have a structure in which an inorganic film and an organic film are alternately stacked with each other. In embodiments, the thin film encapsulation layer TFE may be an encapsulation substrate that is disposed on the light emitting element LD and bonded to the layer on the substrate SUB by a sealant.

A sensing layer TS may be disposed on the thin film encapsulation layer TFE. The sensing layer TS may include a first insulation layer INS1, a first sensing conductive layer MT1, a second insulation layer INS2, a second sensing conductive layer MT2, and/or a third insulation layer INS3.

The first insulation layer INS1 may include an inorganic insulation film including an inorganic material or an organic insulation film including an organic material. The inorganic insulation film may include an inorganic insulation material such as a silicon oxide ($SiO_x$), a silicon nitride ($SiN_x$), a silicon oxynitride ($SiO_xN_y$), an aluminum oxide ($Al_xO_y$), a titanium oxide ($TiO_x$), a tantalum oxide ($Ta_xO_y$), a hafnium oxide ($HfO_x$), or a zinc oxide ($ZnO_x$), but the disclosure is not limited thereto. The organic insulation film may include at least one of an acryl-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin, but the disclosure is not necessarily limited thereto. In embodiments, the first insulation layer INS1 may be omitted, or may be configured as the uppermost layer of a thin film encapsulation layer TFE.

The first sensing conductive layer MT1 may be disposed on the first insulation layer INS1 or the thin film encapsulation layer TFE. The first sensing conductive layer MT1 may be partially opened and not overlap the light emitting element LD of each pixel PXL in a plan view. For example, the first sensing conductive layer MT1 may be disposed in the non-light emitting area NEMA adjacent to the light emitting area EMA.

The first sensing conductive layer MT1 may include a metal layer or a transparent conductive layer. For example, the metal layer may include molybdenum, titanium, copper, aluminum, or an alloy thereof. The transparent conductive layer may include at least one of indium tin oxide (ITO), indium zinc oxide (IZO), zinc oxide (ZnO), indium tin zinc oxide (ITZO), PEDOT, and a metal nano wire, but the disclosure is not necessarily limited thereto. The first sensing conductive layer MT1 may form a connection electrode that connects sensing electrodes.

The second insulation layer INS2 may be disposed on the first sensing conductive layer MT1. The second insulation layer INS2 and the first insulation layer INS1 may include a same material, or the second insulation layer INS2 may include one or more materials selected from the materials that can be included in the first insulation layer INS1.

The second sensing conductive layer MT2 may be disposed on the second insulation layer INS2. The second sensing conductive layer MT2 may be partially opened and not overlap the light emitting element LD of each pixel PXL in a plan view. For example, the second sensing conductive layer MT2 may be disposed in the non-light emitting area NEMA adjacent to the light emitting area EMA.

The second sensing conductive layer MT2 and the first sensing conductive layer MT1 may include a same material, or the second sensing conductive layer MT2 may include one or more materials selected from the materials that can be included in the first sensing conductive layer MT1.

The second sensing conductive layer MT2 may be electrically connected to the first sensing conductive layer MT1 through a contact hole penetrating the second insulation layer INS2. The second sensing conductive layer MT2 may form sensing electrodes.

The third insulation layer INS3 may be disposed on the second sensing conductive layer MT2. The third insulation layer INS3 may include an organic film, but the disclosure is not necessarily limited thereto. In embodiments, the third insulation layer INS3 may be formed of an inorganic film, or may have a structure in which an organic film and an inorganic film are alternately stacked each other.

Alight blocking layer LBP may be disposed on the display element layer DPL, the thin film encapsulation layer TFE, and/or the sensing layer TS. The light blocking layer LBP may include an opening overlapping the light emitting element LD in a plan view. For example, the light blocking layer LBP may be disposed to overlap the non-light emitting area NEMA around the light emitting area EMA.

The light blocking layer LBP may include a light blocking material to prevent light leakage and color mixing defects. For example, the light blocking layer LBP may include a black matrix, but the disclosure is not necessarily limited thereto. In embodiments, the light blocking layer LBP may include a carbon black (CB) and/or a titanium black (TiBK).

A reflection control layer RF may be disposed on the light blocking layer LBP. The reflection control layer RF may selectively absorb light reflected from the inside of the display panel PNL according to a wavelength thereof, thereby improving visibility while preventing light efficiency of the display panel PNL from reducing. The reflection control layer RF may improve display quality by minimizing reflection of external light.

The reflection control layer RF may include a dye, a pigment, or a combination thereof. For example, the reflection control layer RF may include an oxazine-based compound, a cyanine-based compound, a tetraazoporphyrin-based compound, or a squarylium-based compound, but the disclosure is not necessarily limited thereto.

A maximum absorption wavelength of the reflection control layer RF may be in a first wavelength range of about 490 nm to about 505 nm or in a second wavelength range of about 585 nm to about 600 nm. For example, the reflection control layer RF may absorb light having a wavelength outside of a red, green, or blue light emitting wavelength range, thereby implementing the display panel PNL with excellent light efficiency.

Since the reflection control layer RF is provided on the display panel PNL, a separate polarizing plate and/or color filter may be omitted. Accordingly, light loss of the display panel PNL may be minimized while maintaining external light reflection performance. In case that a separate color filter is provided, a reflective color band phenomenon may generally occur, and in order to compensate for this, an organic layer for flattening may need to be additionally applied, resulting in a thicker display panel and disadvantageous characteristics in processing. The display panel PNL according to the embodiment may be provided with the reflection control layer RF to reduce the number of masks and implement a high-quality display device having a thin thickness.

A window WD may be provided on the reflection control layer RE. The window WD may protect a lower member thereof from external impact and provide an input surface and/or a display surface to a user.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
- a first area, a second area, and a bending area between the first area and the second area;
- a light emitting element;
- an inorganic layer disposed on the light emitting element; and
- a thin film encapsulation layer disposed on the inorganic layer,
- wherein the inorganic layer includes a first inorganic pattern in the bending area, and
- wherein the first inorganic pattern includes holes spaced apart from each other.

2. The display device of claim 1, wherein the inorganic layer at least partially covers the light emitting element in the first area.

3. The display device of claim 1, wherein
- the first area and the second area are spaced apart from each other in a first direction, and
- the bending area extends in a second direction intersecting the first direction.

4. The display device of claim 3, wherein
- the first area includes a first edge area extending in the second direction on an edge of the first area, and
- the inorganic layer further includes a second inorganic pattern in the first edge area.

5. The display device of claim 4, wherein
- the second area includes a second edge area extending in the second direction on an edge of the second area, and
- the inorganic layer further includes a third inorganic pattern in the second edge area.

6. The display device of claim 5, wherein the thin film encapsulation layer contacts the first to third inorganic patterns.

7. The display device of claim 1, wherein the inorganic layer includes at least one of bismuth (Bi), ytterbium (Yb), nickel (Ni), cobalt (Co), beryllium (Be), vanadium (V), titanium (Ti), zirconium (Zr), tungsten (W), tantalum (Ta), and molybdenum oxide ($MoO_3$).

8. The display device of claim 1, wherein a refractive index of the inorganic layer is greater than or equal to about 1.0.

9. The display device of claim 1, wherein an extinction coefficient of the inorganic layer is less than or equal to about 4.0.

10. A display device comprising:
- a first area, a second area, and a bending area between the first area and the second area;
- a light emitting element;
- an inorganic layer disposed on the light emitting element; and
- a thin film encapsulation layer disposed on the inorganic layer,
- wherein the inorganic layer includes a first inorganic pattern in the bending area,
- wherein the first area and the second area are spaced apart from each other in a first direction, and
- wherein the bending area extends in a second direction intersecting the first direction,
- wherein the first area includes a first edge area extending in the second direction on an edge of the first area,
- wherein the inorganic layer further includes a second inorganic pattern in the first edge area,
- wherein the second area includes a second edge area extending in the second direction on an edge of the second area,
- wherein the inorganic layer further includes a third inorganic pattern in the second edge area, and
- wherein the first to third inorganic patterns have a same pattern in a plan view.

11. The display device of claim 10, wherein the first inorganic pattern includes an extension and a protrusion protruding from the extension.

12. The display device of claim 10, wherein the first inorganic pattern includes an extension and a bent portion bent from the extension.

13. The display device of claim 10, wherein the first inorganic pattern includes holes spaced apart from each other.

14. A display device comprising:
- a first area and a second area spaced apart from each other in a first direction;
- a bending area disposed between the first area and the second area and bendable with respect to a bending axis extending in a second direction intersecting the first direction;
- a light emitting element;
- an inorganic layer disposed on the light emitting element; and
- a thin film encapsulation layer disposed on the inorganic layer; and
- a reflection control layer disposed on the inorganic layer,
- wherein the inorganic layer includes a first inorganic pattern in the bending area.

15. The display device of claim 14, wherein
- the first area includes a first edge area extending in the second direction on an edge of the first area, and the inorganic layer further includes a second inorganic pattern in the first edge area.

16. The display device of claim 14, wherein the second area includes a second edge area extending in the second direction on an edge of the second area, and the inorganic layer further includes a third inorganic pattern in the second edge area.

17. The display device of claim 14, wherein the thin film encapsulation layer contacts the first inorganic pattern.

18. The display device of claim 14, further comprising:

a light blocking layer disposed between the inorganic layer and the reflection control layer.

19. The display device of claim 14, wherein the reflection control layer includes a pigment or dye.

* * * * *